(12) United States Patent
D'Amato et al.

(10) Patent No.: US 6,556,454 B1
(45) Date of Patent: Apr. 29, 2003

(54) HIGH DENSITY CONTACT ARRANGEMENT

(75) Inventors: Gerald John D'Amato, Loveland, CO (US); Guy Humphrey, Fort Collins, CO (US); Michael Jason Welch, Fort Collins, CO (US)

(73) Assignee: Agilent Technologies, Inc., Palo Alto, CA (US)

( * ) Notice: Subject to any disclaimer, the term of this patent is extended or adjusted under 35 U.S.C. 154(b) by 0 days.

(21) Appl. No.: 09/702,481

(22) Filed: Oct. 31, 2000

(51) Int. Cl.[7] .............................. H05K 7/02; H05K 7/08; H05K 1/00; H01L 23/34
(52) U.S. Cl. ..................... 361/777; 174/250; 174/261; 361/760; 257/724
(58) Field of Search ................................ 174/250–268; 361/760–765, 776–779; 228/180.21, 180.22; 257/724, 778, 787

(56) References Cited

U.S. PATENT DOCUMENTS

| | | | | |
|---|---|---|---|---|
| 5,523,622 A | * | 6/1996 | Harada et al. | ............... 257/734 |
| 5,532,612 A | * | 7/1996 | Liang | ......................... 324/760 |
| 5,547,740 A | * | 8/1996 | Higdon et al. | .............. 428/209 |
| 6,111,756 A | * | 8/2000 | Moresco | ..................... 361/735 |
| 6,127,833 A | * | 10/2000 | Wu et al. | .................... 324/755 |
| 6,198,635 B1 | * | 3/2001 | Shenoy et al. | .............. 261/760 |
| 6,225,695 B1 | * | 5/2001 | Chia et al. | .................. 257/712 |
| 6,407,462 B1 | * | 6/2002 | Banouvong et al. | ........ 257/787 |

* cited by examiner

Primary Examiner—David Martin
Assistant Examiner—Michael L. Lindinger

(57) ABSTRACT

The present disclosure relates to a contact arrangement. The contact arrangement comprises a plurality of contacts formed along a line in a staggered configuration. The staggered configuration arranges the contacts so as to be diagonally spaced from each other along the line such that the contacts have an effective spacing along the line that is smaller than the actual spacing of the contacts. In one embodiment, the contact arrangement is used to construct an integrated circuit chip assembly that comprises a substrate having a die that is provided with a plurality of signal lines and power lines formed on its surface, the signal lines each including a plurality of signal contacts and signal contacts of at least one signal line are arranged in a staggered configuration so as to be diagonally spaced from each other along the at least one signal line such that the signal contacts have an effective spacing along the at least one signal line that is smaller than the actual spacing of the signal contacts of the at least one signal line.

20 Claims, 9 Drawing Sheets ent disclosure relates to a high density contact arrangement. More particularly, the disclosure relates to a high density contact arrangement that facilitates the construction of high signal count integrated circuit chip assemblies.

US 6,556,454 B1

HIGH DENSITY CONTACT ARRANGEMENT

FIELD OF THE INVENTION

The present disclosure relates to a high density contact arrangement. More particularly, the disclosure relates to a high density contact arrangement that facilitates the construction of high signal count integrated circuit chip assemblies.

BACKGROUND OF THE INVENTION

Integrated circuit (IC) chips are often mounted to substrates in the construction of chip assemblies (e.g., flip chip assemblies). In the fabrication of such assemblies, an IC chip is provided with a plurality of contacts for delivery of both signals and power to the chip. The substrate to which the IC chip mounts is similarly provided with a plurality of signal and power contacts. In particular, the substrate is provided with a mirror image arrangement of contacts such that the contacts of the IC chip align with those of the substrate when the chip is disposed on the substrate surface.

FIG. 1 illustrates an example prior art substrate 100 used in the construction of such chip assemblies. As is shown in this figure, the substrate 100 includes a silicon die 102 that is disposed in the center of the substrate. The die 102 is provided with a plurality of contacts 104 that are separately used for signal and power transmission. FIG. 2 illustrates the silicon die 102 shown in FIG. 1 in greater detail. As indicated in this figure, the contacts 104 of the die 102 are normally arranged in aligned, linear rows 200 and columns 202. As is known in the art, each of the contacts 104 is positioned atop an opening (not visible) formed in the die's surface through which signals and power are routed into the substrate 100. During fabrication of the substrate 100, conductive lines (e.g., silk screened conductors) 300 are extended perpendicularly outward from the die 102 within the substrate 100 as indicated in FIG. 3. As shown in this figure, these lines 300 are separated by a pitch distance, P. Due to the large number of contacts 104 provided in the rows 200 and columns 202, the conductive lines are normally closely packed around the periphery of the substrate die 102.

Manufacturers are continually increasing the number of signal contacts on substrate surfaces to increase the number of signals that can be received and transmitted by chip assemblies. As the number of signal contacts 104 grows, so too does the size of the substrate die and the IC chip that attaches to the substrate. To minimize the size of the die, and therefore the substrate and IC chip, manufacturers attempt to maximize the packing density of the contacts 104 so that more contacts can be placed within a given surface area. Such an arrangement is shown in FIG. 3. By way of example, the contacts 104 of any column 202 can be spaced so as to have a "pitch," p, of approximately 225 microns ($\mu$m).

Unfortunately, there are several limitations on how small this pitch dimension can be made. First, as contact spacing becomes smaller, it is more difficult to form the conductive lines that must connect to these contacts. The formation of these lines is further complicated by the columnar formation of the contacts. Specifically, it can be difficult to connect to the contacts of the columns when they are arranged in a straight line perpendicular to the edge of the die. In addition, the substrate die tends to crack when the contacts (and their associated openings) are placed too closely together. Furthermore, due to space limitations of conventional contact arrangements, the contacts are provided farther from the edge of the die as the number of contacts increases. As is known in the art, this increase in distance likewise increases impedance and resistance in the conductive lines in that these lines must be made longer to reach more distant contacts.

From the foregoing, it can be appreciated that it would be desirable to have a contact arrangement that permits high signal density and that avoids at least some of the problems identified above.

SUMMARY OF THE INVENTION

The present disclosure relates to a contact arrangement. The contact arrangement comprises a plurality of contacts formed along a line in a staggered configuration. The staggered configuration arranges the contacts so as to be diagonally spaced from each other along the line such that the contacts have an effective spacing along the line that is smaller than the actual spacing of the contacts.

In one embodiment, the contact arrangement is used to construct an integrated circuit chip assembly that comprises a substrate having a die that forms part of an outer surface of the substrate. The die is provided with a plurality of signal lines and power lines, the signal lines each including a plurality of signal contacts and the power lines each including a plurality of power contacts. The signal contacts of at least one signal line are arranged in a staggered configuration so as to be diagonally spaced from each other along the at least one signal line such that the signal contacts have an effective spacing along the at least one signal line that is smaller than the actual spacing of the signal contacts of the at least one signal line. The assembly further includes an integrated circuit chip having an outer surface comprising a plurality of contacts. The contacts of the chip are arranged in a mirror image of the contacts of the substrate such that the contacts of the chip align with the contacts of the substrate when the chip is positioned atop the substrate die.

The features and advantages of the invention will become apparent upon reading the following specification, when taken in conjunction with the accompanying drawings.

BRIEF DESCRIPTION OF THE DRAWINGS

The invention can be better understood with reference to the following drawings. The components in the drawings are not necessarily to scale, emphasis instead being placed upon clearly illustrating the principles of the present invention.

DETAILED DESCRIPTION

Figure 4:
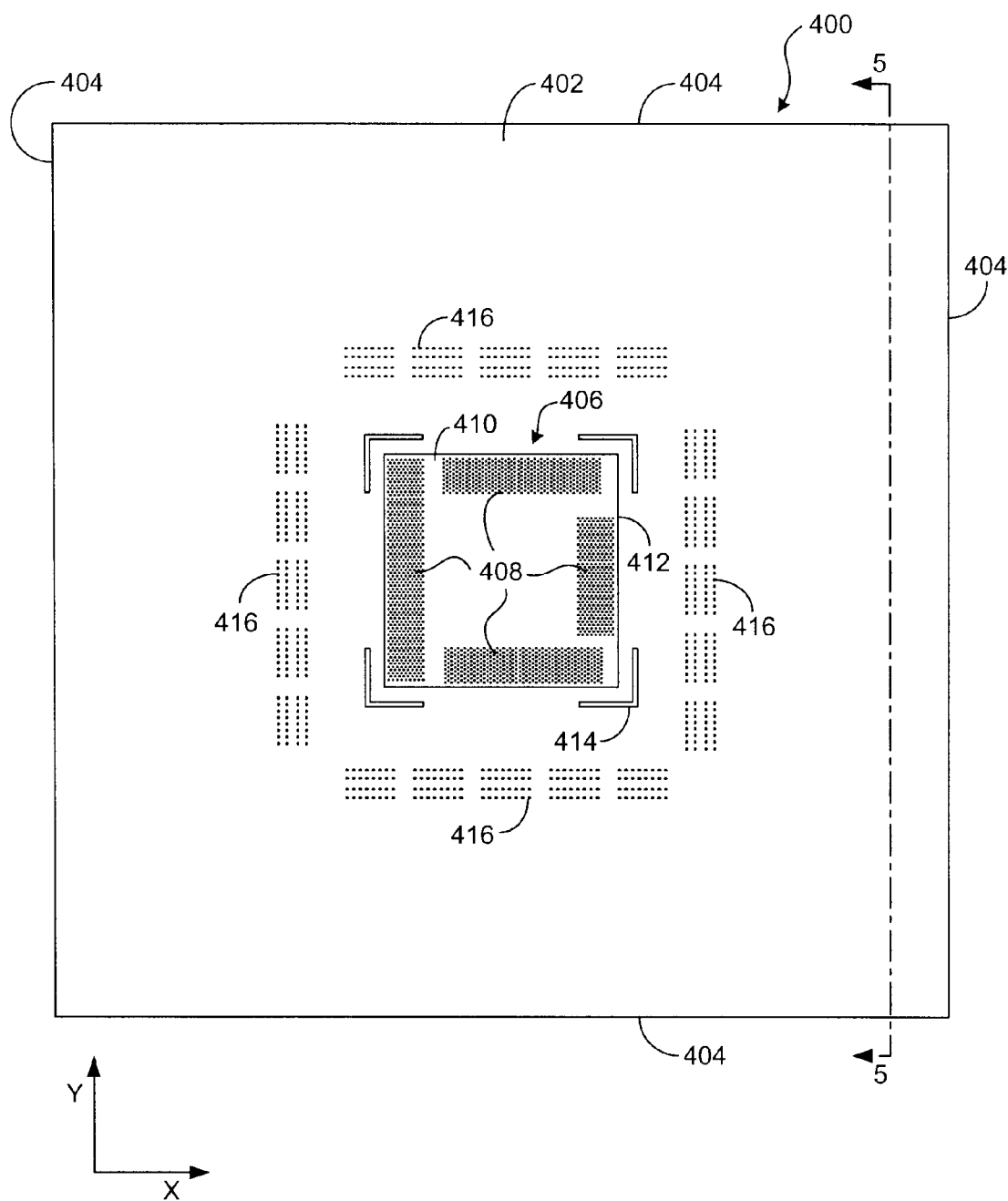
FIG. 4 is a plan view of a substrate of the present invention.

Referring now in more detail to the drawings, in which like numerals indicate corresponding parts throughout the several views, FIG. 4 illustrates a substrate 400 of the present invention. As is discussed below, the substrate 400 can be used to form an IC chip assembly (see FIG. 9). Such an assembly can be used in a variety of applications. By way of example, the assembly can be used as an interface that is provided between a central processing unit (CPU) and memory within a computing device (not shown).

As is illustrated in FIG. 4, the substrate 400 comprises a top surface 402. The substrate 400 is generally rectilinear in shape and, as indicated in FIG. 4, can be formed as a square having a plurality of equal sides 404. Each of the sides 404 can be, for instance, approximately 42 millimeters in length.

Figure 5:
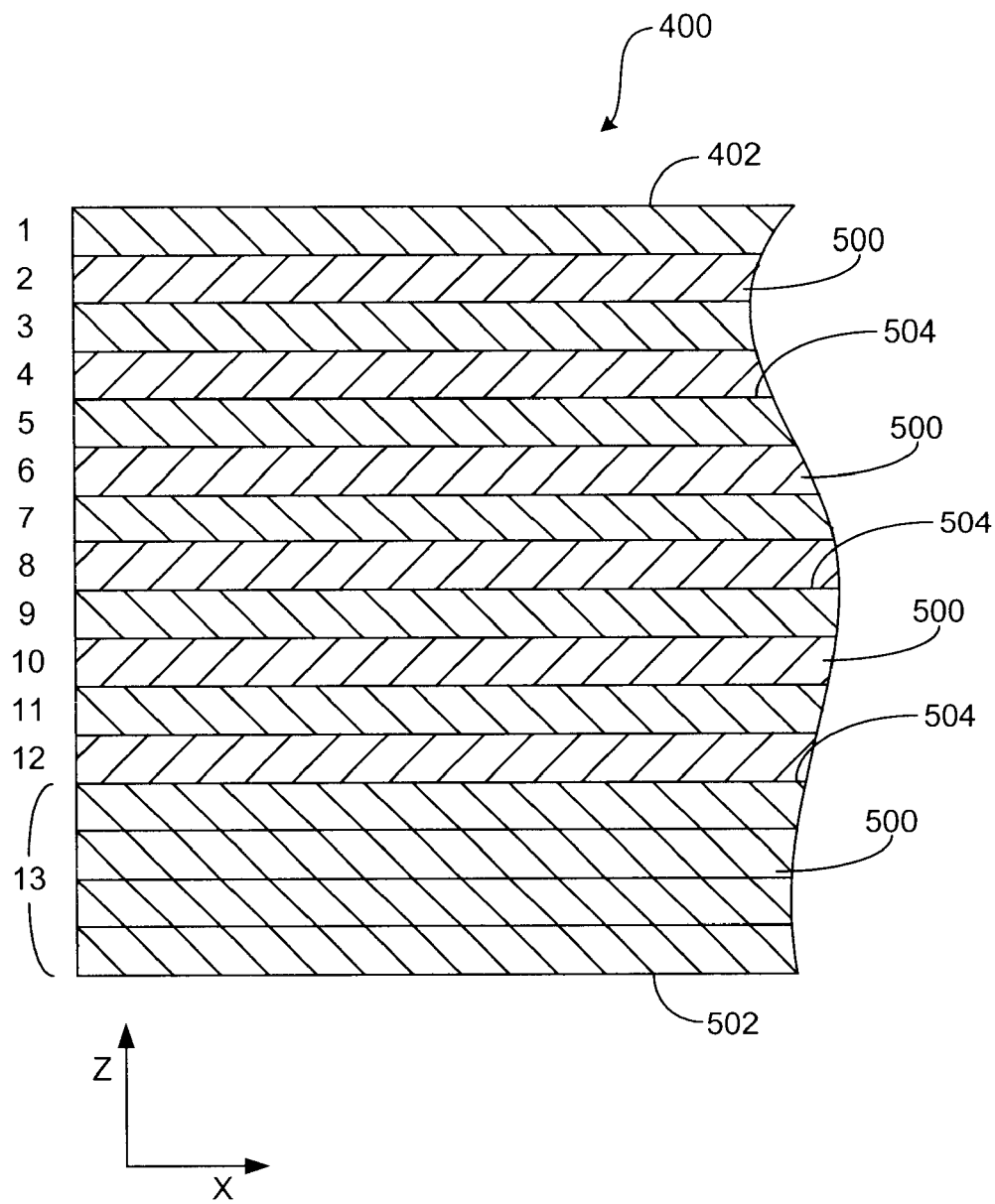
FIG. 5 is a partial cross-sectional view of the substrate taken along line 5—5 in FIG. 3.

FIG. 5 illustrates the substrate 400 in cross-section. In particular, FIG. 5 illustrates a side cross-sectional view of the substrate 400 taken along line 5—5 of FIG. 4. As indicated in this figure, the substrate 400 is composed of a plurality of material layers 500 that are arranged in a stacked configuration from the top surface 402 to a bottom surface 502 of the substrate 400. Typically, each of the material layers 500 is formed of a ceramic material, although it will be understood that other materials can be used, if desired. In the arrangement shown in FIG. 5, thirteen different layers are provided. Typically formed between each of the material layers 500 are metalized layers 504 that are used to transmit the signals and power throughout the interior of the substrate 400. These signals and power are normally routed from the top surface 402 from contacts provided thereon down through the various layers 500 of the substrate 400 through blind vias (not shown) to route these signals and power throughout the substrate and ultimately down to the bottom surface 502 which similarly comprises a plurality of contact (not shown).

Returning to FIG. 4, the substrate 400 further comprises a die 406 that is positioned in a central area of the substrate. Normally, this die 406 is composed of a semiconductor material such as a silicon material. As is indicated in FIG. 4, the die 406 comprises a plurality of contacts 408 that are arranged on a top surface 410 of the die 406. Similar to the substrate 400, the die 406 is normally rectilinear in shape and can be, for instance, square in shape so as to have a plurality of equal sides 412. By way of example, each of these sides 412 can be approximately 14 millimeters in length. Beyond the periphery of the die 406 can be provided a plurality of alignment marks 414 that are used to align an IC chip with the die 406 when mounting the chip to the top surface 402 of the substrate 400. Optionally, the substrate 400 can further include a plurality of peripheral contacts 416 that are arranged about the die 406.

Figure 6:
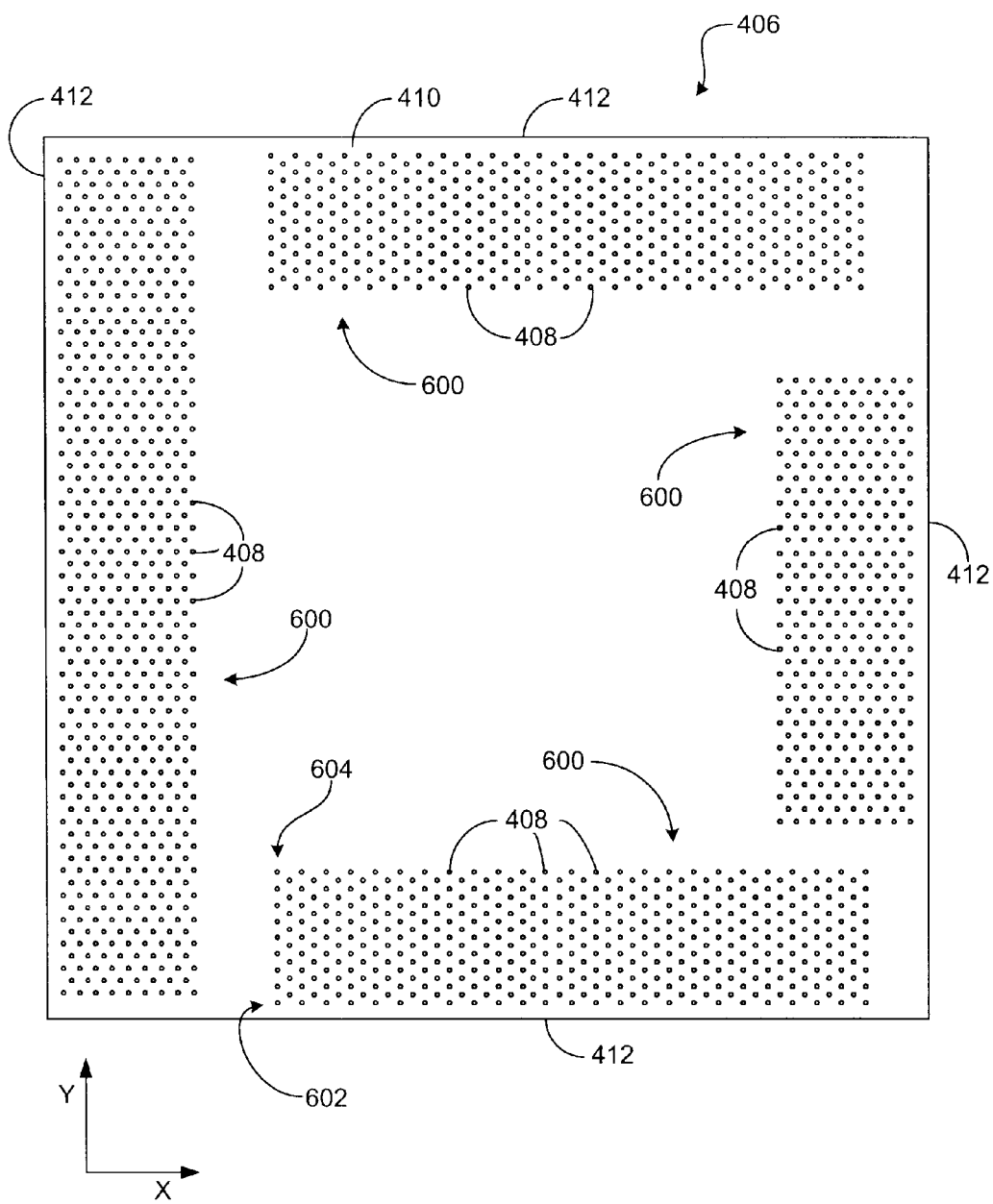
FIG. 6 is a plan view of a die of the substrate shown in FIG. 4.

Turning to FIG. 6, the substrate die 406 is illustrated in greater detail. As indicated in this figure, each of the contacts 408 is normally circular in shape. More particularly, each of the contacts 408 normally comprises a semispherical solder bump having a high lead content. The contacts 408 are normally arranged in separate groups 600 that are disposed about the periphery of the die 406. Although shown in particular group orientations, it is to be understood that this arrangement is exemplary only and that alternative arrangements are therefore feasible and may even be more advantageous. Moreover, it will be appreciated that separate contact groups are not necessary to the invention. As illustrated in FIG. 6, each of the groups 600 comprises a plurality of rows 602 and columns 604 of contacts 408. The various rows 602 of contacts 408 are arranged in a staggered relationship from the sides 412 of the die 406 toward the center of the die. As is discussed in the following, this staggered relationship permits a high density contact arrangement for the die 406 as well as the IC chip that mounts to the die.

Figure 7:
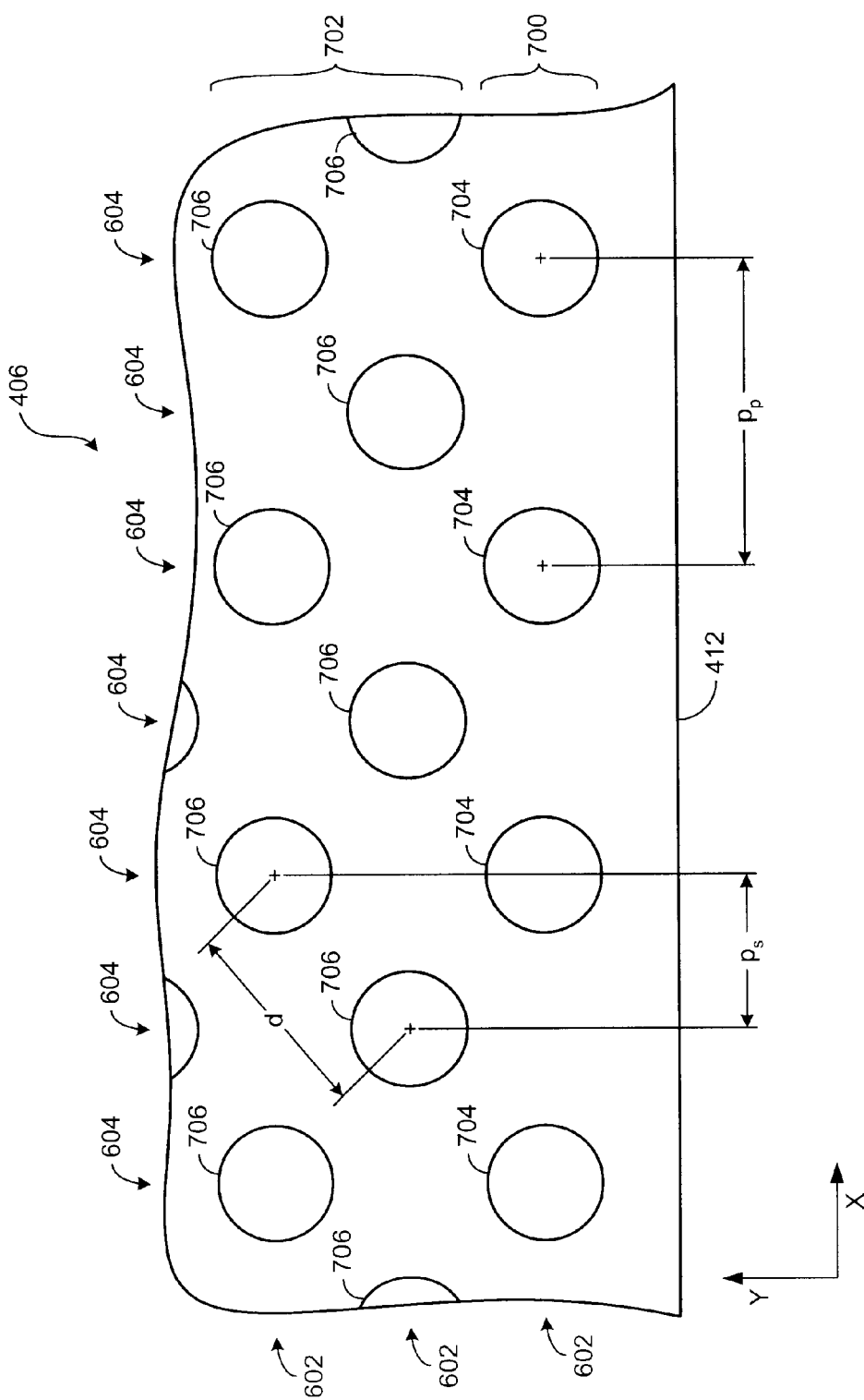
FIG. 7 is a detail view of a contact arrangement used on the die shown in FIG. 6.

FIG. 7 illustrates the contact arrangement in greater detail. In particular, FIG. 7 illustrates a portion of the substrate die 406 near a side 412 of the die. As is identified in FIG. 7, the die 406 includes power lines 700 and signal lines 702. Typically, the die 406 is formed such that the power lines 700 and signal lines 702 are provided in an alternating arrangement from the side 412 of the die towards the center of the die. Normally, each of the power lines 700 further alternate from a positive power line to a negative power line from the die side 412 towards the center of the die. Accordingly, by way of example, the power line 700 directly adjacent the side 412 of the die 706 can comprise a negative or ground power line while the next power line inward toward the center of the die 406 can comprise a positive power line. Although this arrangement is preferred, it is to be understood that alternative arrangements can be used, if desired. Each power line 700 includes a plurality of power contacts 704. Similarly, each of the signal lines 702 includes a plurality of signal contacts 706. By way of example, each power contact 704 and signal contact 706 is approximately 125 $\mu$m in diameter. Normally, each of the contacts 704, 706 is formed atop an opening (not visible) such as a blind via that extends down into the die and substrate and outward therefrom to one or more of the metalized layers 504 illustrated in FIG. 5.

As is apparent from FIG. 7, the power contacts 704 in the power lines 700 are normally linearly arranged along a straight line. However, the signal contacts 706 of the signal lines 702 are arranged in a staggered configuration such that each signal contact is positioned diagonal relative to the next signal contact as the signal line is traversed along the X direction indicated in the figure. Each of the power contacts 704 is separated by a pitch dimension, $p_p$, which normally is constant. By way of example, this pitch can be approximately 400 $\mu$m. The signal contacts 706 on the other hand are separated by a distance, d, that similarly normally is constant. By way of example, the distance, d, can be approximately 225 $\mu$m. Although actually spaced the distance, d, the signal contacts 706 have an effective spacing or pitch, $p_s$, of approximately 200 $\mu$m. Accordingly, although the signal contacts 706 are actually separated by a relatively large distance, d, they are arranged along the signal line 702 in the X direction so as to have a relatively small pitch.

The staggered configuration of the signal contacts 706 in the signal lines 702 facilitates high signal densities. As noted above, there are limitations on how closely manufacturers can place the signal contacts (and their associated openings) together. For instance, at the time of submission of this disclosure, manufacturers have difficulty in placing signal contacts closer than approximately 225 $\mu$m in the construction of substrates. However, with the arrangement shown in FIG. 7, an effective spacing, $p_s$, (i.e., pitch) of approximately 200 $\mu$m is achieved by staggering the signal contacts 706 in the signal lines 702. Accordingly, a signal contact pitch of 200 $\mu$m can be achieved while still maintaining a 225 $\mu$m spacing, d, between the signal contacts 706. It will be appreciated that the foregoing dimensions are provided by way of example only. Accordingly, it is to be understood that, as manufacturers develop the techniques that enable closer spacing of the contacts, higher contact densities will be achievable without staggering. Regardless, however, signal contact staggering such as that illustrated in FIG. 7 will still enable even smaller effective spacing.

Figure 1:
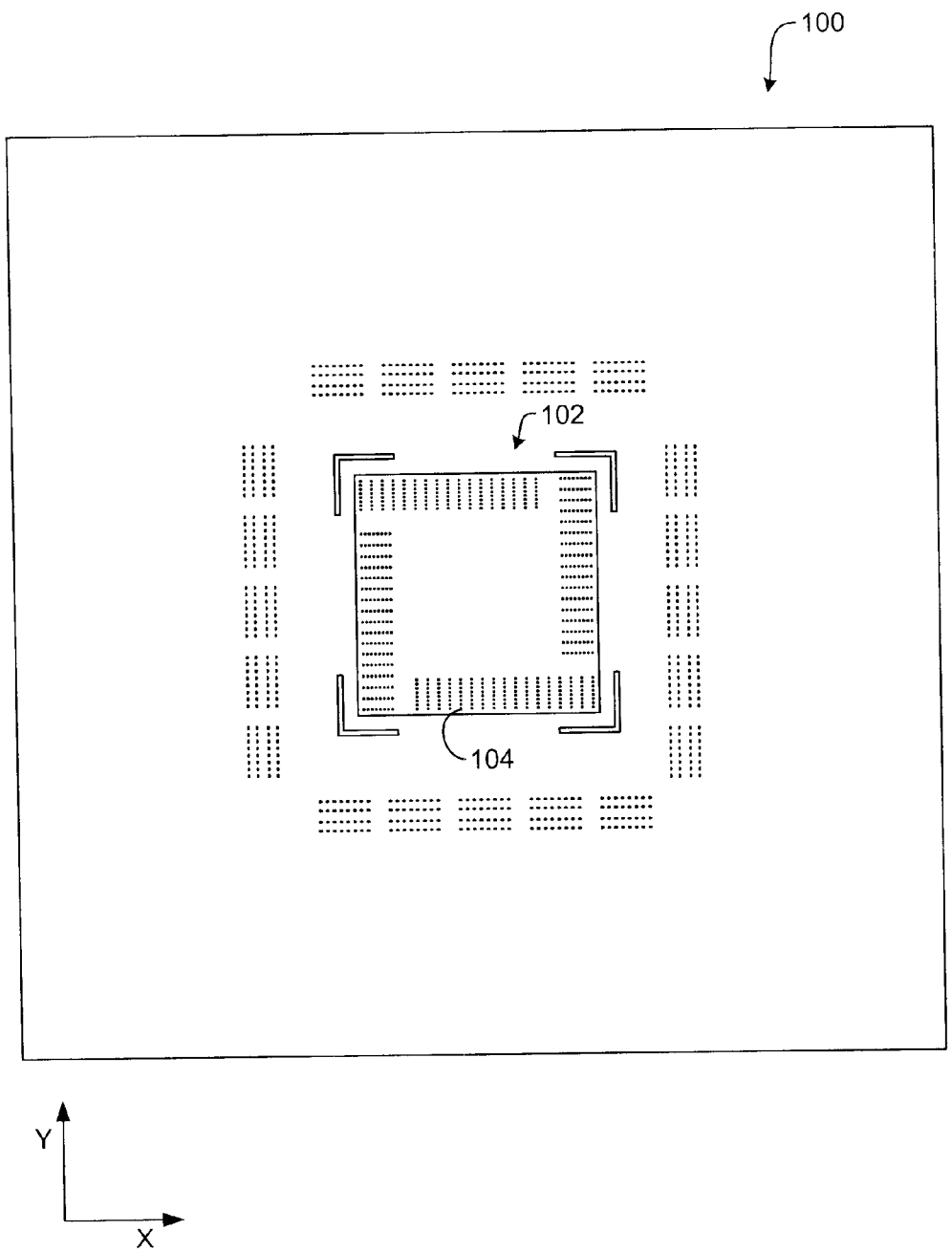
FIG. 1 is a plan view of a substrate of the prior art.
Figure 2:
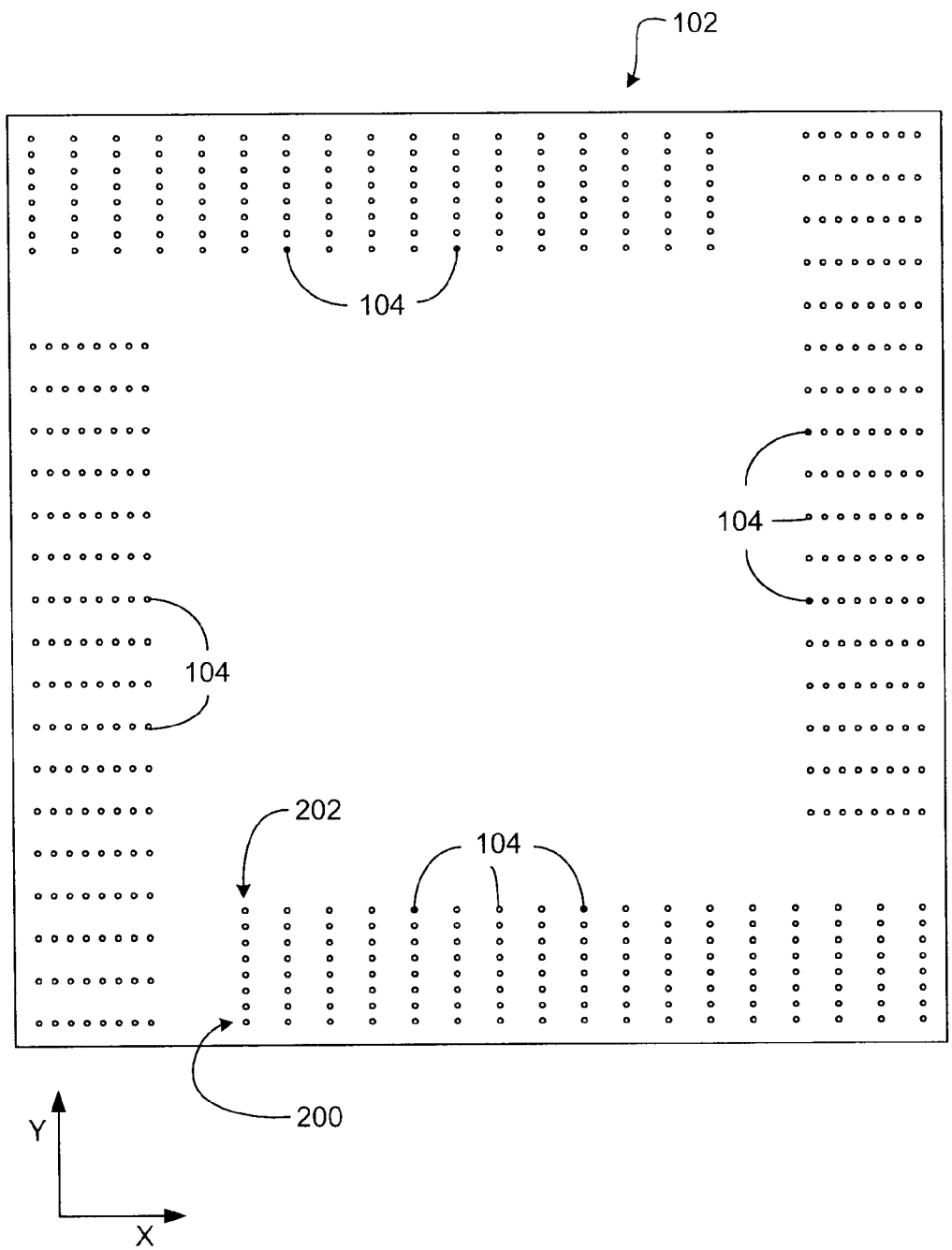
FIG. 2 is a plan view of a silicon die of the substrate shown in FIG. 1.
Figure 3:
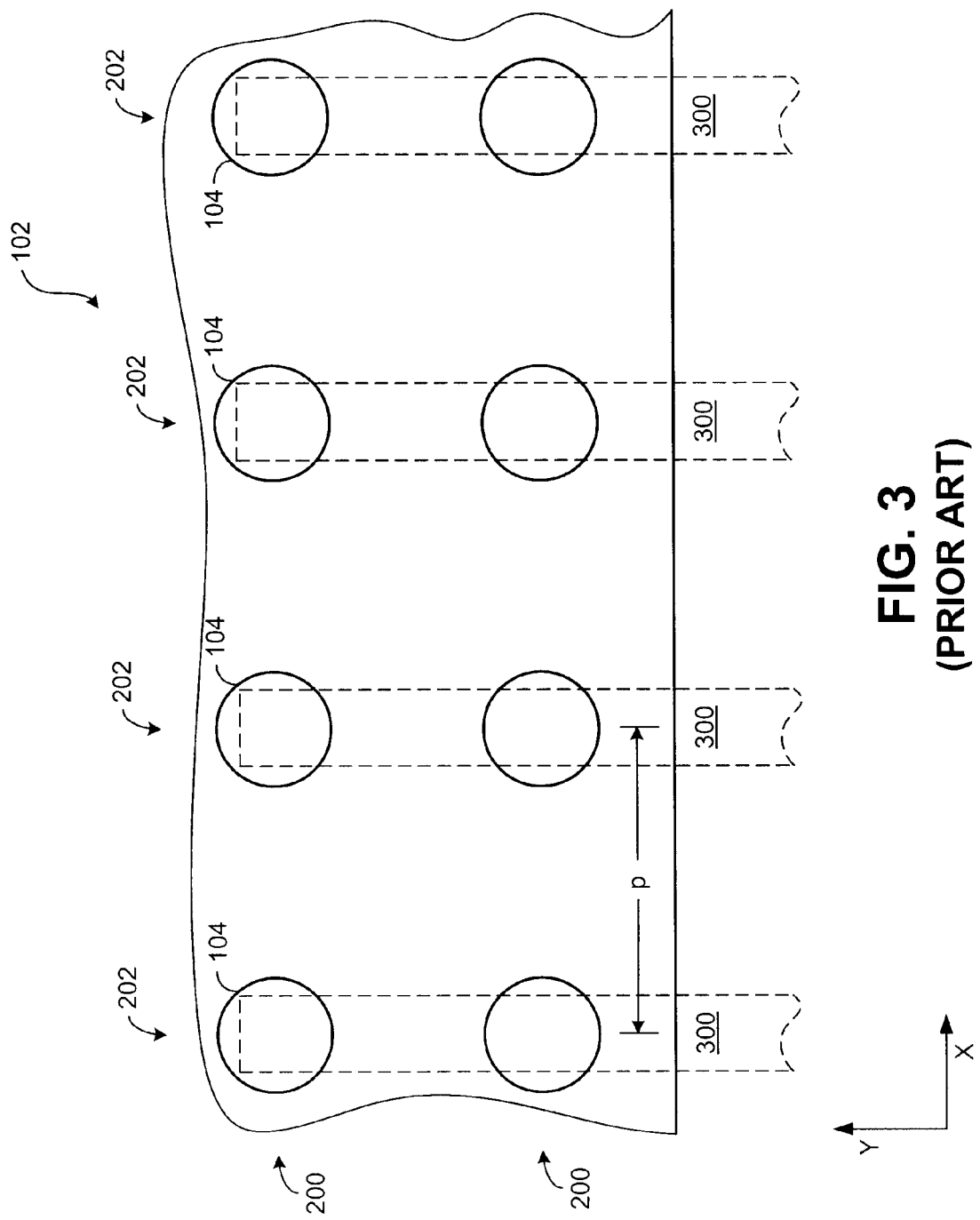
FIG. 3 is a detail view of the die shown in FIG. 2.
Figure 8:
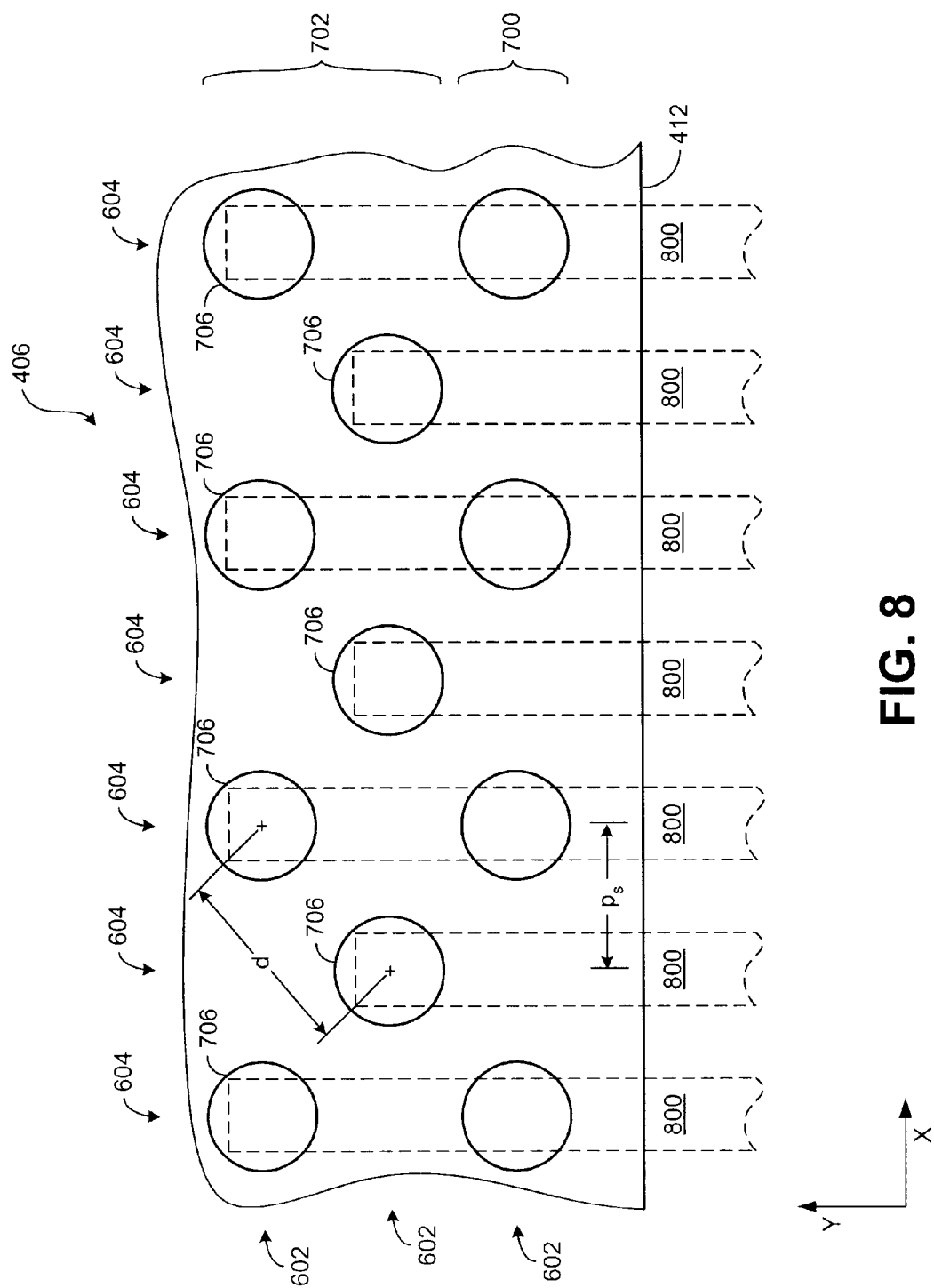
FIG. 8 is a detail view of the contact arrangement of FIG. 7 and indicating the provision of signal lines.

In addition to permitting for smaller effective spacing (i.e., pitch), the staggered arrangement illustrated in FIG. 7 further facilitates connection of the signal contacts 706 to the conductive lines formed within the substrate. As indicated in FIG. 8, many such conductive lines 800 can be connected with the signal contacts 706 such that the lines 800 are spaced from each other by the distance, $p_s$. As is apparent from FIG. 8, the signal contacts 706 are more easily accessible from the sides 412 of the die 406 due to the staggered arrangement of each of the signal lines 702. Furthermore, the staggered configuration permits a larger number of contacts to be disposed within a given surface area (compare FIG. 8 with FIG. 3). Accordingly, higher contact densities are achievable. This, in turn, facilitates smaller dies 406 and smaller IC chips. Due to the smaller size of the dies 406, a larger number of dies can be produced on a given semiconductor wafer such that fabrication yields can be increased. Similarly, due to the greater number of dies 406 that can be formed on the wafer, the impact of wafer defects is attenuated in that a smaller percentage of dies are affected by such defects. Moreover, in that the packing density of the contacts is increased, the various contacts provided on the surface 410 of the die 406 can be arranged closer to the periphery of the die such that the conductive lines formed on the substrate 400 can be shorter, thereby reducing impedance and resistance.

Figure 9:
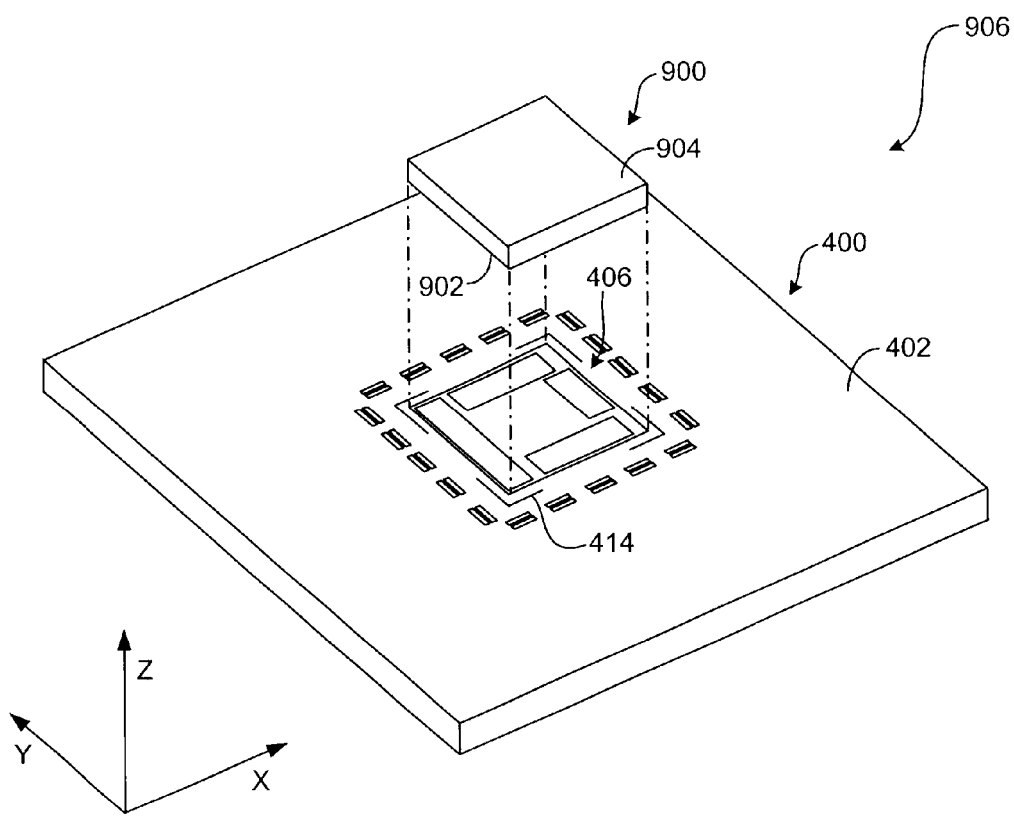
FIG. 9 is a perspective view illustrating mounting of an IC chip to the substrate shown in FIG. 4.

FIG. 9 illustrates mounting of an IC chip 900 to the substrate 400 to form an IC chip assembly. The IC chip 900 includes a first or top surface 902 and a second or bottom surface 904. The top surface 902 is provided with a contact arrangement that is the mirror image of the contact arrangement of the die 406 of the substrate 400. Accordingly, when the IC chip 900 is inverted, it can be placed on top of the die 406 such that the contacts of the chip aligned with the various contacts of the die 406. This arrangement is generally known in the art as a flip chip assembly. Once the chip is positioned on top of the substrate 400, the chip and substrate are heated to melt the contacts provided on both such that the contacts of the chip joined with the contacts of the die 406 to form an integrated circuit chip assembly 906.

While particular embodiments of the invention have been disclosed in detail in the foregoing description and drawings for purposes of example, it will be understood by those skilled in the art that variations and modifications thereof can be made without departing from the scope of the invention as set forth in the following claims. For instance, although the power contacts 704 are shown as being arranged along a straight line, it will be understood that these contacts could, alternatively, be arranged in a staggered configuration as the signal contacts 706 to further increase the contact density.

What is claimed is:

1. A contact arrangement, comprising:
    a plurality of signal contacts formed along an independent signal line in a staggered configuration exclusive of other contacts;
    a plurality of power contacts formed along a power line exclusive of other contacts;
    wherein the staggered configuration of the signal line arranges the signal contacts so as to be diagonally spaced from each other along the signal line such that the signal contacts have an effective spacing along the line that is smaller than the actual spacing of the signal contacts.

2. The arrangement of claim 1, further comprising a plurality of independent power lines, a power line being arranged between adjacent signal lines, each power line comprising a plurality of power contacts and being exclusive of other contacts.

3. The arrangement of claim 2, wherein the power contacts of each power line are arranged in a straight line.

4. The arrangement of claim 1, wherein each contact is a solder bump.

5. An electrical device, comprising:
    an outer surface; and
    a plurality of signal contacts formed along an independent signal line exclusive of other contacts in a staggered configuration on the outer surface;
    a plurality of power contacts formed along a power line exclusive of other contacts;
    wherein the staggered configuration of the signal line arranges the signal contacts so as to be diagonally spaced from each other along the signal line such that the signal contacts have an effective spacing along the signal line that is less than the actual spacing of the signal contacts.

6. The device of claim 5, further comprising a plurality of independent power lines arranged on the outer surface, a power line being arranged between adjacent signal lines, each power line comprising a plurality of power contacts and being exclusive of other contacts.

7. The device of claim 6, wherein the power contacts of each power line are arranged in a straight line.

8. The device of claim 5, wherein each contact is a solder bump.

9. An integrated circuit chip assembly, comprising:
    a substrate having a die that forms part of an outer surface of the substrate, the die being provided with a plurality of independent signal lines and power lines formed on its surface, the signal lines each including a plurality of signal contacts exclusively and the power lines each including a plurality of power contacts exclusively, the signal contacts of at least one signal line being arranged in a staggered configuration so as to be diagonally spaced from each other along the at least one signal line such that the signal contacts have an effective spacing along the at least one signal line that is smaller than the actual spacing of the signal contacts of the at least one signal line; and
    an integrated circuit chip having an outer surface comprising a plurality of contacts, the contacts being arranged in a mirror image of the contacts of the substrate such that the contacts of the integrated circuit chip align with the contacts of the substrate when the chip is positioned atop the substrate die.

10. The assembly of claim 9, wherein the power contacts of each power line are arranged in a straight line.

11. The assembly of claim 9, wherein each contact is a solder bump.

12. The assembly of claim 9, wherein the signal lines and power lines are arranged in an alternating configuration.

13. The assembly of claim 9, wherein the signal contacts in the staggered configuration have an effective spacing of approximately 200 µm.

14. The assembly of claim 13, wherein the signal contacts in the staggered configuration have an actual spacing of approximately 225 µm.

15. A method for arranging contacts, comprising:
    forming signal contacts in independent signal lines exclusive of other contacts along a surface of a device;
    forming power contacts in independent power lines exclusive of other contacts along the surface of the device; and staggering the positions of the signal contacts along the signal line such that an effective spacing of the signal contact along the signal line is smaller than the actual spacing of the signal contacts in the signal line.

16. The method of claim 15, wherein the step of forming the power lines comprises arranging each of the power contacts in a straight line.

17. The arrangement of claim 15, wherein each contact is a solder bump.

18. The method of claim 15, wherein the steps of forming signal lines and power lines comprises forming alternating signal and power lines.

19. An electrical device, comprising:

an outer surface; and a plurality of independent signal lines each including a plurality of signal contacts arranged in a staggered configuration being exclusive of power contacts; and a plurality of independent power lines each including a plurality of power contacts and being exclusive of signal contacts;

wherein the signal and power contacts are arranged in a non-orthogonal grid pattern such that the contacts are diagonally oriented within the grid pattern.

20. The device of claim 19, wherein the power contacts of each power line are arranged in a straight line.

\* \* \* \* \*